United States Patent [19]

Strid et al.

[11] Patent Number: 4,827,211
[45] Date of Patent: May 2, 1989

[54] WAFER PROBE

[75] Inventors: Eric W. Strid; Kimberly R. Gleason, both of Portland, Oreg.

[73] Assignee: Cascade Microtech, Inc., Beaverton, Oreg.

[21] Appl. No.: 8,847

[22] Filed: Jan. 30, 1987

[51] Int. Cl.⁴ .................. G01R 1/06; G01R 31/02
[52] U.S. Cl. ............... 324/158 P; 324/158 F; 324/73 PC; 324/72.5
[58] Field of Search ............ 324/72.5, 73 PC, 158 F, 324/158 P; 333/246

[56] References Cited

U.S. PATENT DOCUMENTS

| | | | |
|---|---|---|---|
| 3,963,986 | 6/1976 | Morton et al. .................. | 324/72.5 X |
| 4,574,235 | 3/1986 | Kelly et al. .................... | 324/158 FX |
| 4,593,243 | 6/1986 | Lao et al. ...................... | 324/158 FX |
| 4,686,463 | 8/1987 | Logan ........................... | 324/158 FX |
| 4,697,143 | 9/1987 | Lockwood et al. ............ | 324/158 FX |

OTHER PUBLICATIONS

Cascade Microwave; "Introducing the World's First Microwave Wafer Probing Equipment"; 1983 Cascade Microwave; pp. 1-3.
Malm; "Reduction of Stray Fields about SEM Samples"; IBM Technical Disclosure, vol. 21, No. 7; Dec. 1978, pp. 2973-2974.

Primary Examiner—Reinhard J. Eisenzopf
Assistant Examiner—Vinh P. Nguyen
Attorney, Agent, or Firm—Dellett, Smith-Hill and Bedell

[57] ABSTRACT

A wafer probe for accessing bonding pads on a planar device includes contact pads mounted on one edge of the under side of a dielectric substrate board and arranged to align with the bonding pads to be accessed. Coplanar ground and signal conductors deposited on the under side of the substrate board form constant impedance transmission lines for connecting test equipment to the contact pads. A ground contact is mounted on the upper side of the substrate near the end on which the contact pads are mounted, the ground contact being connected by a conductive path to the ground conductors on the under side of the substrate. When two such wafer probes simultaneously access bonding pads on the same planar device, the ground conductors of the two probes are interconnected by a conductive sheet of foil extending between the ground contacts on the upper sides of the substrates of both wafer probes.

15 Claims, 3 Drawing Sheets

WAFER PROBE

BACKGROUND OF THE INVENTION

The present invention relates in general to probes for accessing points on small integrated circuit (IC) elements fabricated on semiconductive or dielectric wafers, and in particular to a system for providing an electrical connection between probes accessing the same IC element.

Wafer probes provide temporary electrical contacts between test equipment and the very small bonding pads of planar devices such as IC elements fabricated on semiconductive wafers. Use of wafer probes permits operation and testing of IC elements prior to separating, bonding and packaging the individual IC elements on a wafer. However, many existing wafer probes do not permit accurate measurement of high frequency (e.g. 2 GHz and above) signals appearing on an IC element because the signal conduction paths provided by the probes to connect bonding pads on the IC elements to measurement equipment do not have constant impedance. Impedance mismatches in a signal path cause signal reflections which lead to errors in signal measurements.

Copending U.S. application Ser. No. 605,462, filed Apr. 30, 1984, describes a wafer probe comprising coplanar ground and signal conductors deposited on the under side of a tapered alumina substrate, each signal conductor and its adjacent ground conductor forming a separate, constant impedance transmission line. The ground conductors are all electrically interconnected by a metallic channel which spans the signal conductors without touching them. Each transmission line extends from a coaxial cable connector at the wide end of the substrate to contact pads at the narrow end of the substrate, the contact pads being arranged to align with bonding pads on an IC element. This probe is particularly useful for accessing IC elements in which the bonding pads conveying signals to be accessed appear in a row and the row includes at least one additional bonding pad connected to ground. Since each transmission line of the probe includes a signal conductor and a ground conductor, and since the ground conductors are all interconnected by the channel, the constant impedance environment of each transmission line extends from the cable connector to the IC element even when only one ground conductor of one transmission line contacts a grounded bonding pad on the IC element.

IC elements often contain two parallel rows of bonding pads, and in such case each row may be accessed by a separate probe. However in many IC elements, a grounded bonding pad appears in only one of the rows of bonding pads and not in the other row, and therefore the ground conductors of one of the two probes cannot directly access ground on the IC element. One might solder a jumper wire between tips of ground conductors of the two probes so as to permit ground conductors in one probe to indirectly access ground through the other probe, thereby permitting the constant impedance transmission lines provided by the first probe to extend to the IC element without interruption. However, the probes are small and a jumper wire capable of interconnecting ground conductors of the two probes would be very small, difficult to install, and easy to break.

SUMMARY OF THE INVENTION

A wafer probe for accessing bonding pads on an integrated circuit (IC) element comprises coplanar ground and signal conductors deposited in an alternating fashion on the under side of a tapered substrate probe board, each signal conductor and its adjacent ground conductors forming a separate, constant impedance transmission line. The ground conductors are all electrically interconnected by a metallic channel which spans the signal conductors without touching them. Each transmission line connects a coaxial cable connector at the wide end of the substrate to contact pads at the narrow end of the probe board, the contact pads being arranged to align with the bonding pads on the IC element.

In accordance with one aspect of the invention, a ground contact is mounted on the upper side of the probe board near its narrow end, the ground contact being connected by a conductive path to the ground conductors on the under side of the probe board. When two such wafer probes simultaneously access parallel rows of bonding pads on the same IC element, the ground conductors of the two probes may be interconnected by placing a sheet of conductive foil on the ground contacts on the upper sides of the probe boards of both wafer probes. Thus, when one of the probes is unable to directly access ground on the IC element, it may nonetheless indirectly access the IC element ground through the other probe, thereby to extend its constant impedance transmission lines to the IC element bonding pads without substantial discontinuity.

In accordance with another aspect of the invention, a "finger" comprising rubber, plastic or other resilient material is mounted on top of the probe board, one end of the finger being fixed in relation to the probe board and the other end of the finger pressing against the ground contact on the upper side of the substrate. When the foil for interconnecting ground contacts of two probes is inserted between the finger and the ground contact of each probe, the finger of each probe holds the foil in place on the ground contact of the probe.

In accordance with a further aspect of the invention, the conductive foil contains a transparent aperture so that the when the foil is positioned on the probes, the aperture is positioned above the bonding pads being accessed. The aperture allows an operator to observe the position of each probe with respect to the bonding pads.

It is accordingly an object of the invention to provide a probe which may be utilized in pairs for accessing adjacent rows of bonding pads on an IC element, wherein conductors of such probe pairs may easily be electrically interconnected near the points of contact with the bonding pads.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

DETAILED DESCRIPTION

Figure 1:
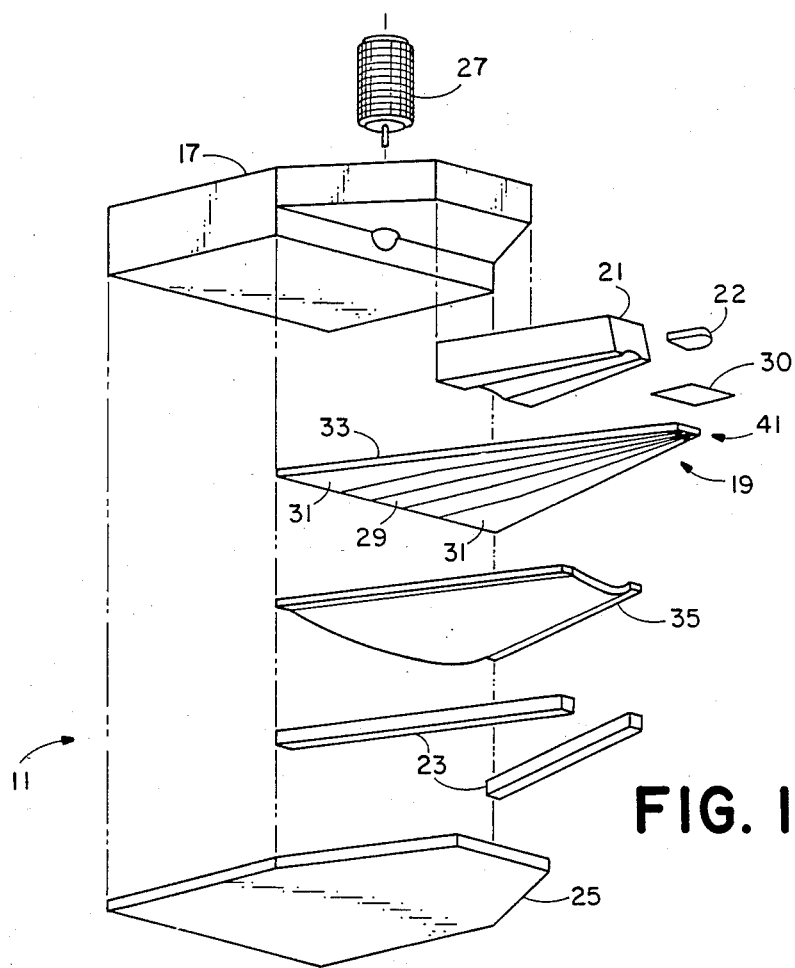
FIG. 1 is an exploded perspective view of the wafer probe of the present invention.
Figure 3:
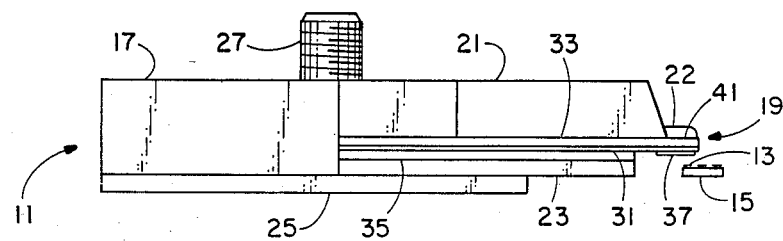
FIG. 3 is an elevation view of the wafer probe of FIG. 2.
Figure 2:
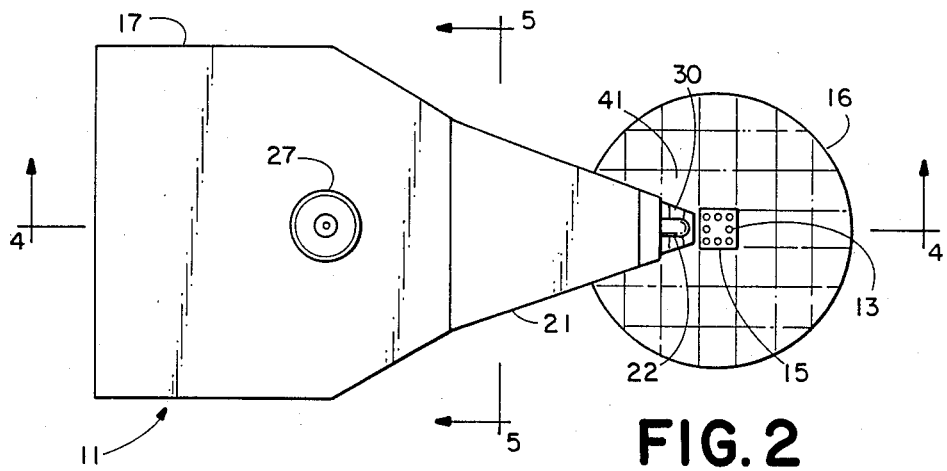
FIG. 2 is a plane view of the wafer probe in relation to a wafer element to be tested.
Figure 4:
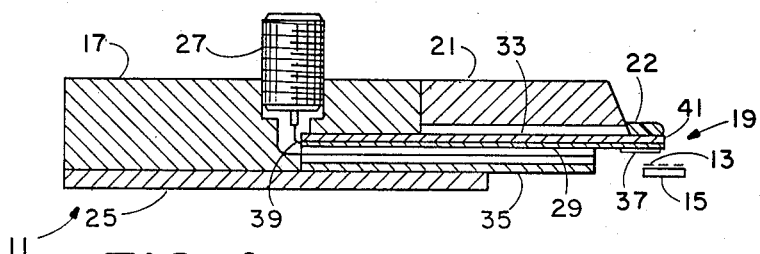
FIG. 4 is a sectional view (4—4) of the wafer probe of FIG. 2.
Figure 5:
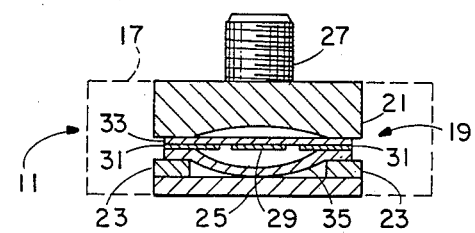
FIG. 5 is a sectional view (5—5) of the wafer probe of FIG. 2.

FIG. 1 shows in an exploded perspective view a wafer probe 11 according to the present invention, adapted to provide a transmission line connecting bonding pads on a planar, integrated circuit (IC) element formed on a semiconductor wafer to a coaxial cable, so that signals may be transmitted between the bonding pads and electrical test equipment via the transmission line and the coaxial cable. FIGS. 2 and 3 are top and side elevation views, respectively, of the wafer probe 11 of FIG. 1, and FIGS. 4 and 5 are front sectional views 4—4 and 5—5 of the wafer probe 11 of FIG. 2. FIGS. 2-4 illustrate the probe nearly engaging minutely spaced bonding pads 13 of a planar IC device 15 on a wafer 16.

With reference to FIGS. 1-5, probe 11 includes probe mounting block 17 to which the wide end of a tapered transmission line assembly 19 is attached. A tapered metal channel 35 is connected to the under side of the transmission line assembly 19 and a pair of intermediate "absorber layers" 23 are mounted on the under side of the metal channel 35 along its tapered edges. A tapered upper "absorber layer" 21 is mounted above a portion of the narrow end of the tapered transmission line assembly 19. A lower "absorber layer" 25, mounted on the under side of the probe mounting block 17, extends under the wide end of the transmission line assembly 19, the lower absorber layer 25 being spaced from the transmission line assembly by channel 35 and intermediate absorber layers 23. A metallic (suitably gold) ground contact 30 is mounted on the upper side of transmission line assembly 19 near the tip 41 of its narrow end, and a "finger" 22, suitably of rubber, plastic or other resilient insulating material, is attached to the narrow end of upper absorber layer 21, such that the under side of finger 22 presses against ground contact 30. A coaxial cable connector 27 is mounted on top of the probe mounting block 17.

Figure 6:
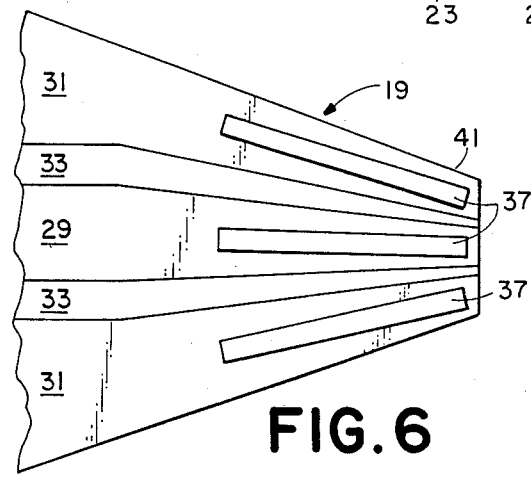
FIG. 6 is a bottom view of the tip of the probe board of FIG. 2 showing a coplanar transmission line arrangement of the ground and signal conductors.

FIG. 6 is a bottom view of the tip 41 of transmission line assembly 19. With reference to FIGS. 1-6, transmission line assembly 19 comprises a signal conductor 29 and ground conductors 31 mounted on a tapered probe board 33 made of a dielectric material such as alumina ($Al_2O_3$), approximately 10 mils thick. Signal conductor 29 and ground conductors 31 are strips of conducting material such as gold deposited in the alumina substrate of probe board 33. As best seen in FIG. 6, conductors 29 and 31 converge toward the end of probe board tip 41 to align above the bonding pads of the device 15 being tested. Contact with the device 15 bonding pads 13 is made through, for example, small nickle or gold contact pads 37 attached to the ends of signal conductor 29 and ground conductors 31.

Signal conductor 29's width and distances from ground conductors 31 are held constant up to a short distance from probe board tip 41. Then signal conductor 29 and ground conductors 31 are tapered down, for example, from a 10-mil width to a 1-mil width, at the narrow end of probe board tip 41. The gaps between the signal conductor 29 and ground conductors 31 are correspondingly tapered near probe board tip 41 such that the transmission line formed by signal conductor 29 and ground conductors 31 is of a constant characteristic impedance (e.g. fifty ohm) through the length of transmission line assembly 19 to the points of contact with the bonding pads 13 of the device 15 under test. The bonding pads typically have a surface area of approximately 2 mils square, having a width similar to conductors 29 and 31 at probe board tip 41, and are typically center spaced approximately 4 mils apart. However, it is understood that the conductors 29 and 31 may be tapered to different spacings and widths to align with different bonding pad arrangements while maintaining constant characteristic impedance.

As seen in FIGS. 3-5, transmission line assembly 19 is generally surrounded by absorber layers 21, 23 and 25. These absorber layers are made of a microwave absorbing material having a relative characteristic impedance close to that of free space ($|z|/|z_0| = 0.5$ to $0.7$) but with a high magnetic loss coefficient. Material of this characteristic impedance will not reflect microwave energy or produce dielectric transmission line modes. Typical examples of suitable absorber material are iron, or ferrite-containing Emerson & Cuming, Inc. "Eccosorb" brand absorber material models GDS, MF-S, MF, and CR-S. As shown in FIG. 5, upper absorber layer 21, grooved to provide spatial separation of the absorber from signal conductor 29, is mounted on the upper side of probe board 33. Intermediate and lower absorber layers 23 and 25 are mounted below probe board 33 in contact with metal channel 35. Metal channel 35, contacting both ground conductors 31 and spanning signal conductor 29, maintains absorber spacing around signal conductor 29, improves structural integrity of transmission line assembly 19, electrically bonds opposing ground conductors 31, and provides shielding for signal conductor 29. Transmission line assembly 19 and connector 27 are attached to mounting block 17 as best shown in FIG. 4. In the preferred embodiment, mounting block 17 is also formed of a microwave absorbing material similar to that of the absorber layers. Signal conductor 29 is terminated on connector 27 by conducting tab 39. Connector 27 provides means for connecting an external fifty ohm coaxial cable (not shown) to wafer probe 11 for carrying signals to or from external test equipment. The spacing of the contact pads 37 at the probe tip 41 can be modified to correspond to the spacing of bonding pads 13 of the device 15 to be accessed by the probe.

The wafer probe 11 is adapted for accessing bonding pads 13 which are substantially aligned in a row on the IC element 15. A typical IC element provides two parallel rows of bonding pads extending along opposing edges of the device, and two wafer probes may be utilized to simultaneously access the two rows of bonding pads. However, a grounded bonding pad may appear in only one of the rows of bonding pads and not in the other row, and therefore the ground conductors of one of the probes cannot directly access ground on the IC element. If the ground conductors of one of the probes are not connected to ground on the IC device, then an impedance discontinuity occurs at the junctions between the transmission lines of the probe and the bonding pads being accessed.

In accordance with the present invention, metallic contact 30, mounted on the upper side of the tip 41 of the probe board 33 of transmission line assembly 19, is connected by conductive paths to the ground conductors 31 on the under side of the probe board. When two such wafer probes simultaneously access parallel rows of bonding pads on the same IC element, the ground conductors of the two probes may be interconnected by a sheet of conductive foil placed on the ground contacts 30 of both wafer probes. Thus, when one of the probes is unable to directly access a grounded bonding pad on the IC element, it may nonetheless indirectly access the IC element ground through the other probe, thereby extending its constant impedance transmission lines to the IC element without discontinuity. The resilient finger 22 abutting ground contact 30 holds the foil in place on the ground contact 30 when the foil is inserted between the finger 22 and the ground contact 30.

Figure 7:
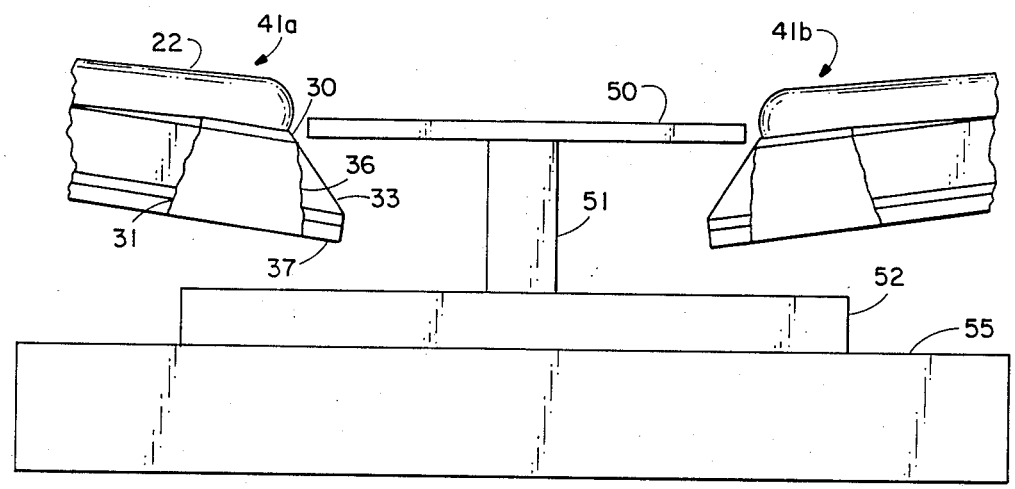
FIG. 7 is an elevation view of the tips of two wafer probes prior to engaging a sheet of conductive foil.
Figure 8:
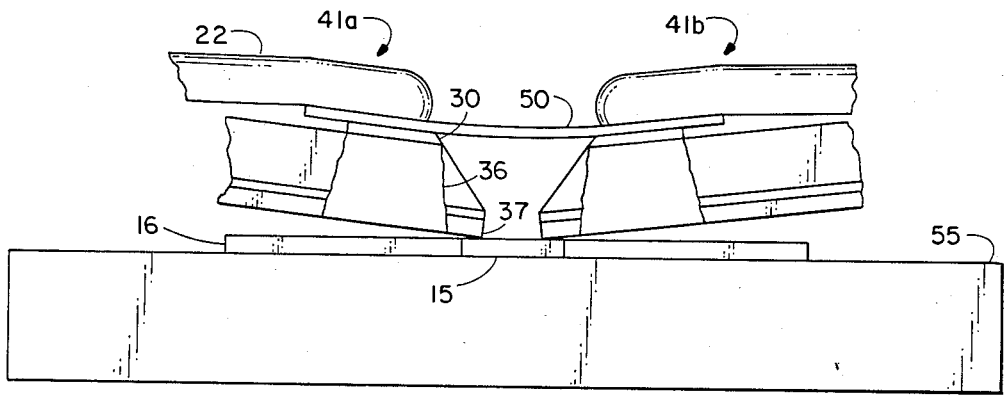
FIG. 8 is an elevation view of the two wafer probe tips of FIG. 7 after engaging the sheet of conductive foil.

FIGS. 7 and 8 are side views of the tips 41a and 41b of the transmission line assemblies of two probes before and after engaging a conductive foil 50. The ground contact 30 of each probe is electrically connected to ground conductors 31 on the under side of the probe. tip by a thin sheet of conductive epoxy paint 36 covering the side edge of the probe tip. The foil 50 is temporarily attached to the top of a support pillar 51 by a weak adhesive, and pillar 51 is mounted on a glass slide 52. The glass slide 52 is placed on a movable chuck 55 which normally holds a wafer to accessed by the probes. Initially, the probe tips 41a and 41b are spaced apart so that foil 50 mounted on pillar 51 may be positioned between the probe tips without touching them. The probe tips 41a and 41b are then moved toward the foil 50 so that the foil 50 slips between the finger 22 and the ground contact 30 of each probe, the foil pushing each finger slightly upward. Once foil 50 is in place between fingers 22 and ground contacts 30, fingers 22 supply sufficient gripping pressure such that as the slide 52 and pillar 51 are subsequently removed from between the probe tips, the foil 50, only weakly adhered to pillar 51, detaches from pillar 51 and remains in place between the finger 22 and ground contact 30 of each probe. As shown in FIG. 8, once the foil 50 is in place, the wafer 16 is placed on chuck 55 and chuck 55 is raised so that the bonding pads of an IC element 15 of the wafer 16 engage contact pads 37 of the probes.

Figure 9:
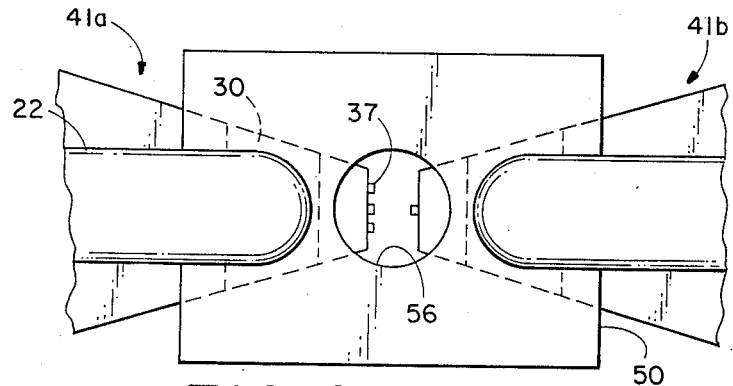
FIG. 9 is a plane view of the two wafer probe tips and the sheet of conductive foil of FIG. 8.

FIG. 9 shows a plan view of the probe tips 41a and 41b and the interconnecting foil 50 of FIG. 8. An aperture 56 is provided in foil 50 such that the positions of the contact pads 37 with respect to bonding pads on the IC device therebelow may be viewed from above whereby the contact and bonding pads may be properly aligned.

Thus there has been described a wafer probe having contact pads arranged on one edge of the under side of a dielectric substrate board to align with bonding pads of a planar device to be accessed, and having coplanar ground and signal conductors deposited on the under side of the substrate board forming constant impedance transmission lines to connect test equipment to the contact pads. A ground contact is mounted on the upper side of the substrate near the end containing the contact pads, the ground contact being connected by a conductive path to the ground conductors on the under side of the substrate. A flexible finger abuts the contact. When two such wafer probes simultaneously access bonding pads on the same planar device, the ground conductors of the two probes may be conveniently interconnected by inserting a conductive sheet of foil between the ground contact and the abuting finger of each wafer probe.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A probe for connecting electrical test equipment to a point on a planar device, comprising:
    a probe board having an upper side, a lower side and a tip end;
    a signal conductor and a ground conductor mounted on the lower side of the probe board, said signal conductor including a signal contact mounted on the tip end of said probe board for engaging said point;
    a ground contact mounted on the upper side of said probe board at said tip end; and
    conductive means interconnecting said ground contact and said ground conductor.

2. The probe according to claim 1 wherein said ground contact is mounted above said signal contact.

3. The probe according to claim 1 wherein said signal and ground conductors are spaced so as to form a transmission line having substantially constant characteristic impedance throughout its length.

4. The probe according to claim 1 further comprising means for holding a conductive sheet of foil firmly against said ground contact.

5. A probe for connecting electrical test equipment to a point on a planar device, comprising:
    a probe board having an upper side and a lower side;
    a signal conductor and a ground conductor spaced on the lower side of the probe board, said signal conductor including a tip end for engaging a point on said small planar device;
    a ground contact mounted on the upper side of said probe board;
    means for electrically interconnecting said ground contact and said ground conductor; and
    means for holding a conductive sheet of foil firmly against said ground contact, wherein said means for holding comprises resilient material abutting said ground contact such that when said conductive sheet is inserted between said resilient material and said ground contact, said resilient material and said ground contact apply pressure on said conductive sheet therebetween, thereby holding said conductive sheet firmly against said ground contact.

6. A probe system for connecting electrical test equipment to points on a planar device, comprising:
    a plurality of probes each comprising a probe board having an upper side, a lower side, and having a tip end, at least one signal conductor and at least one ground conductor mounted on said probe board, at least one of said signal and ground conductors including a signal contact mounted on the lower side of said probe board proximate to said tip end for engaging a point on said planar device, each probe further comprising a ground contact mounted on the upper side of said probe board proximate said to said tip end and a conductive path interconnecting said ground contact and said at least one ground conductor; and conductive means for interconnecting the ground contacts of said plurality of probes.

7. A probe system for connecting electrical test equipment to points on a planar device, comprising:

a plurality of probes each comprising a probe board having an upper side, a lower side and a tip end, at least one signal conductor and at least one ground conductor mounted on the probe board, at least one of said signal and ground conductors including a signal contact on the lower side of the probe board proximate to said tip end for engaging a point on said planar device, each probe further comprising a ground contact mounted on the upper side of said probe board proximate said tip end, and a conductive path interconnecting said ground contact and said at least one ground conductor; and a sheet of conductive material abutting the gound contacts of said plurality of probes.

8. A probe system for connecting electrical test equipment to points on a planar device, comprising:

a plurality of probes each comprising a probe board having an upper side and a lower side, at least one signal conductor and at least one ground conductor spaced on the lower side of the probe board, at least one of said signal and ground conductors including a tip end for engaging a point on said planar device, a ground contact mounted on the upper side of said probe board proximate said tip end of said at least one of said signal and ground conductors, and a conductive path interconnecting said ground contact and said at least one ground conductor; and conductive means for interconnecting the ground contacts of said plurality of probes, wherein said conductive means comprises a sheet of conductive material abutting the ground contacts of said plurality of probes, and wherein said sheet of conductive material has an aperture through which points on said planar device may be viewed when said sheet of material is mounted on top of the ground contacts of said plurality of probes.

9. A probe system for connecting electrical test equipment to points on a planar device, comprising:

a plurality of probes, each probe comprising a probe board having an upper side and a lower side, at least one signal conductor and at least one ground conductor spaced on the lower side of the probe board, at least one of said signal and ground conductors including a tip end for engaging a point on said planar device, a ground contact mounted on the upper side of said probe board proximate said tip end of said at least one of said signal and ground conductors, a conductive path interconnecting said ground contact and said at least one ground conductor, and resilient material abutting said ground contact; and a conductive sheet inserted between said resilient material and the ground contact of each of said plurality of probes such that said resilient material and said ground contact of each of said probes apply pressure on said conductive sheet therebetween thereby holding said conductive sheet firmly against each ground contact, said conductive sheet electrically interconnecting the ground contacts of each of said probes.

10. For a system connecting electrical test equipment to points on a planar device, the system comprising a plurality of probe boards each having an upper side and a lower side, at least one signal conductor and at least one ground conductor spaced on the lower side of each probe board, at least one of said signal and ground conductors including a tip end for engaging a point on said planar device, a ground contact mounted on the upper side of each probe board proximate said tip end of said at least one of said signal and ground conductors, a conductive path interconnecting said ground contact and said at least one ground conductor, and resilient material firmly abutting said ground contact, a method for utilizing a conductive sheet to interconnect ground contacts of each of said plurality of probe boards, the method comprising the steps of:

attaching said conductive sheet to a platform with a weak adhesive;

inserting portions of said conductive sheet between the resilient material and the ground contact of each of said plurality of probe boards such that the resilient material and ground contact of each of said probes applies pressure on said conductive sheet therebetween, thereby holding said conductive sheet firmly against the ground contact; and detaching said platform from said sheet.

11. A probe for connecting electrical test equipment to a point on a planar device, comprising:

a dielectric support member having an upper side and a tip end;

a ground conductor and a signal conductor mounted on said support member to form a substantially constant impedance transmission line extending to said tip end, said signal conductor including a signal contact extending beyond said support member at said tip end for engaging said point;

a ground contact mounted on the upper side of said support member proximate to said tip end; and conductive means interconnecting said ground contact and said ground conductor.

12. A probe for connecting electrical test equipment to a point on a planar device, comprising:

a support member of dielectric material having a tip end;

a ground conductor and a signal conductor mounted on said support member and forming a transmission line extending proximate to said tip end, said signal conductor including a signal contact extending from said tip end for engaging said point;

a ground contact mounted on top of said support member proximate to said tip end; and conductive means interconnecting said ground contact and said ground conductor proximate to said tip end.

13. An apparatus for connecting electrical test equipment to points on a planar device, comprising:

a plurality of probes, each probe comprising a support member of dielectric material having a tip end, a ground conductor and a signal conductor mounted on said support member, said ground and signal conductors forming a transmission line extending proximate to said tip end, said signal conductor including a signal contact extending from said tip end for engaging one of said points, each probe further comprising a ground contact mounted on said support member proximate to said tip end, and conductive means proximate to said tip end interconnecting said ground contact and said ground conductor;

means for supporting said plurality of probes such that signal contacts of said probes engage said points and such that the ground contacts of said probes are juxtaposed and substantially aligned in a common plane; and conductive material abutting the ground contacts of said probes for maintaining said ground contacts at a common potential.

14. The apparatus in accordance with claim 13 wherein said conductive material comprises a conductive sheet.

15. The apparatus in accordance with claim 14 wherein each of said plurality of probes further comprises resilient material abutting its ground contact such that when said conductive sheet is inserted between said resilient material and said ground contact, said resilient material and said ground contact apply pressure on said conductive sheet therebetween, hereby holding said conductive sheet firmly against said ground contact.

* * * * *

UNITED STATES PATENT AND TRADEMARK OFFICE
CERTIFICATE OF CORRECTION

PATENT NO. : 4,827,211
DATED : May 2, 1989
INVENTOR(S) : Eric W. Strid, Kimberly R. Gleason It is certified that error appears in the above-identified patent and that said Letters Patent is hereby corrected as shown below:

Column 3, line 65, "in" should be --on--.

Column 5, line 30, delete the period (.) between "probe" and "tip".

Column 7, line 6, delete "said to".

Column 10, line 13, "hereby" should be --thereby--.

Signed and Sealed this

Twelfth Day of December, 1989

Attest:

JEFFREY M. SAMUELS

Attesting Officer     Acting Commissioner of Patents and Trademarks